(12) United States Patent
Kim (10) Patent No.: US 7,952,124 B2
(45) Date of Patent: May 31, 2011

(54) IMAGE SENSOR AND A METHOD FOR MANUFACTURING THE SAME

(75) Inventor: Jong Min Kim, Guro-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 341 days.

(21) Appl. No.: 12/200,021

(22) Filed: Aug. 28, 2008

(65) Prior Publication Data
US 2009/0057797 A1   Mar. 5, 2009

(30) Foreign Application Priority Data

Aug. 30, 2007   (KR) .................. 10-2007-0087549

(51) Int. Cl.
*H01L 31/0232* (2006.01)
(52) U.S. Cl. ............ 257/292; 257/432; 257/E31.127; 257/290

(58) Field of Classification Search .......... 257/290–292, 257/432, 70
See application file for complete search history.

(56) References Cited

U.S. PATENT DOCUMENTS

7,482,646 B2 *   1/2009   Gao et al. ............. 257/292
* cited by examiner

*Primary Examiner* — N Drew Richards
*Assistant Examiner* — Mamadou Diallo
(74) *Attorney, Agent, or Firm* — Saliwanchik, Llyod & Eisenschenk (57) ABSTRACT

An image sensor and manufacturing method thereof are provided. An insulating layer having a wiring can be provided on a semiconductor substrate. A barrier wiring can be provided in the insulating layer between the wiring of a unit pixel and an adjacent wiring of an adjacent pixel. A device isolating pattern can be provided on the barrier wiring, and a lower electrode can be provided on the insulating layer and the wiring. A photodiode can be provided on the lower electrode, and an upper electrode can be provided on the photodiode.

18 Claims, 5 Drawing Sheets

IMAGE SENSOR AND A METHOD FOR MANUFACTURING THE SAME

CROSS-REFERENCE TO RELATED APPLICATION

The present application claims the benefit under 35 U.S.C. §119 of Korean Patent Application No. 10-2007-0087549, filed Aug. 30, 2007, which is hereby incorporated by reference in its entirety.

BACKGROUND

An image sensor is a semiconductor device that can be used to convert an optical image into an electrical signal. Image sensors are typically categorized as a charge coupled device (CCD) or a complementary metal oxide semiconductor (CMOS) image sensor (CIS).

CMOS image sensors generally operate by sequentially detecting the electrical signals of each unit pixel in a switching manner using a photodiode and a MOS transistor in each unit pixel.

In general, a CMOS image sensor has a photodiode region for receiving a light signal and converting it into an electrical signal and a transistor region for processing the electrical signal. The photodiode region and the transistor region are typically horizontally arranged on a semiconductor substrate.

With a horizontal-type CMOS image sensor, the photodiode and the transistor are horizontally adjacent to each other. Accordingly, a separate region on the semiconductor substrate is needed for the photodiode after forming the transistor region.

BRIEF SUMMARY

Embodiments of the present invention provide an image sensor and a manufacturing method thereof utilizing a vertical integration of a transistor circuit and a photodiode.

In an embodiment, an image sensor can include: an insulating layer provided on a semiconductor substrate and having a wiring in a unit pixel; a barrier wiring provided in at least a portion of the insulating layer between the wiring of the unit pixel and an adjacent wiring of an adjacent pixel; a device isolating pattern provided on the barrier wiring; a photodiode provided on the device isolating pattern and the lower electrode; and an upper electrode provided on the photodiode.

In another embodiment, a method for manufacturing an image sensor can include: forming an insulating layer on a semiconductor substrate, wherein the insulating layer has a wiring in a unit pixel, and wherein at least a portion of the insulating layer has a barrier wiring between the wiring of the unit pixel and an adjacent wiring of an adjacent pixel; forming a device isolating pattern on the barrier wiring; forming a lower electrode on the wiring and at least a portion of the insulating layer; forming a photodiode on the device isolating pattern and the lower electrode; and forming an upper electrode on the photodiode.

DETAILED DESCRIPTION

When the terms "on" or "over" or "above" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

An image sensor and manufacturing method thereof according to embodiments of the present invention will now be described with reference to the accompanying drawings.

Figure 9:
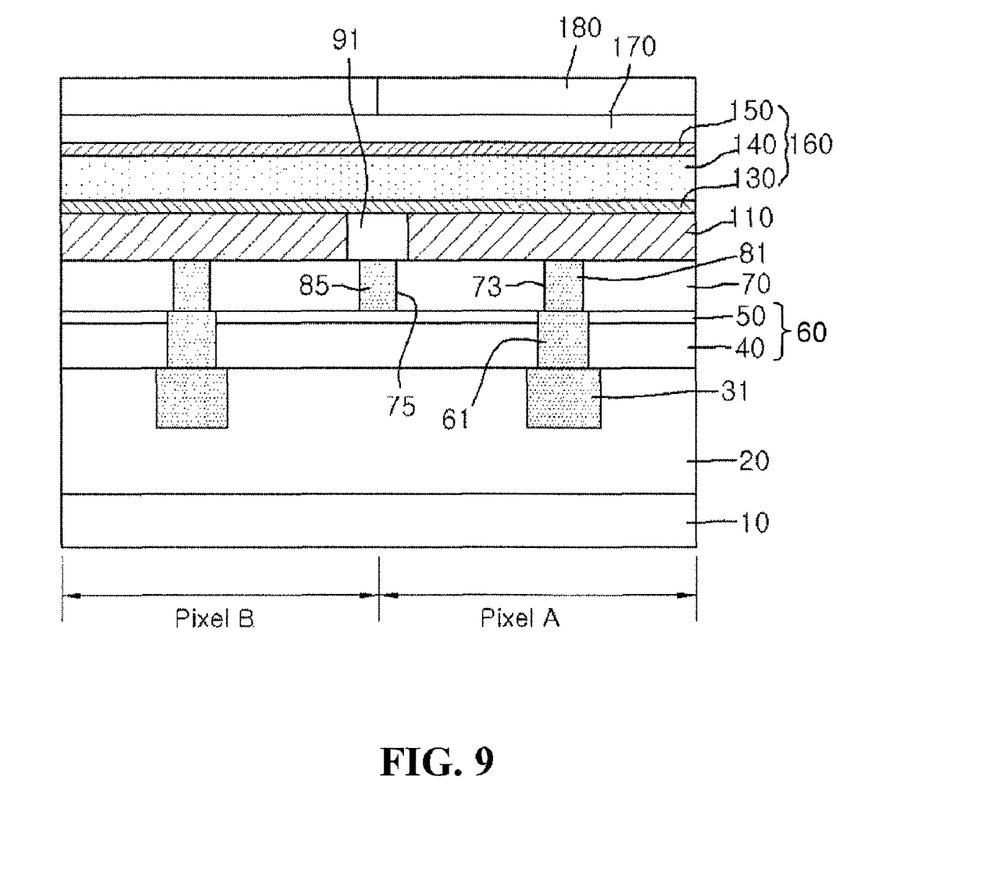

FIG. 9 is a cross-sectional view showing an image sensor according to an embodiment of the present invention.

Referring to FIG. 9, a lower insulating layer 20 can be provided on a semiconductor substrate 10. A lower wiring 31 can be provided in the lower insulating layer 20.

A transistor circuit region (not shown) can be provided on the semiconductor substrate 10 and electrically connected to the lower wiring 31 in each unit pixel. The transistor circuit region can include, for example, a transfer transistor, a reset transistor, a drive transistor, and/or a select transistor. Each unit pixel on the semiconductor substrate 10 can be provided with a transistor circuit. Though two unit pixels, pixel A and pixel B have been shown for illustration purposes, a skilled artisan will recognize that any suitable number of pixels can be present in an image sensor of the present invention.

An upper insulating layer 60 can be provided on the lower insulating layer 20 and the lower wiring 31. The upper insulating layer can include a first insulating layer 40 and a second insulating layer 50. The first insulating layer 40 and the second insulating layer can each be formed of any suitable material known in the art. For example, the first insulating layer 40 can be an oxide film, and the second insulating layer 50 can be a nitride film. A skilled artisan will recognize that the upper insulating layer 60 can include any suitable number of insulating layers. Thus, while a first insulating layer 40 and a second insulating layer 50 are shown by way of example, embodiments of the present invention are not limited thereto.

A first wiring 61 can be provided in the upper insulating layer 60 to be electrically connected to the lower wiring 31.

A third insulating layer 70 can be provided on the upper insulating layer 60 and the first wiring 61.

A second wiring 81 can be provided in the third insulating layer 70 on at least a portion of first wiring 61. A barrier wiring 85 can be provided on the upper insulating layer 60 in a portion of the third insulating layer 70 that is not over the first wiring 61.

The barrier wiring 85 can have a lower voltage applied than that of the second wiring 81 to help block photo charges of a photodiode from a unit pixel to adjacent pixels.

A device isolating pattern 91 can be provided on the barrier wiring 85. In an embodiment, the device isolating pattern 91 can be provided on the barrier wiring 85 and a small portion of the third insulating layer 70 adjacent to the barrier wiring 85.

A lower electrode 110 can be provided on the second wiring 81 and at least a portion of the third insulating layer 70. The lower electrode 110 can be provided on the second wiring 81 of each unit pixel. Also, the lower electrode 110 can be separated from the lower electrode 110 of an adjacent pixel by the device isolating pattern 91. That is, the device isolating pattern 91 can be provided between the lower electrode 110 and the lower electrode 110 of an adjacent unit pixel. In an embodiment, a top surface of the lower electrode 110 can be approximately the same height as a top surface of the device isolating pattern 91.

A photodiode 160 can be provided on the lower electrode 110 and the device isolating pattern 91. The photodiode 160 can include, for example, a first conducting layer 130, an intrinsic layer 140, and a second conducting layer 150. In an embodiment, the first conducting layer 130 can be formed of n-type amorphous silicon, the intrinsic layer 140 can be formed of amorphous silicon, and the second conducting layer 150 can be formed of p-type amorphous silicon.

An upper electrode 170 can be provided on the photodiode 160. The upper electrode 170 can be formed of, for example, a transparent electrode with good transmissivity and high conductivity.

A color filter 180 can be formed on the upper electrode 170. One color filter 180 can be formed in each unit pixel to separate colors from incident light. The color filter 180 can be a red color filter, a green color filter, or a blue color filter.

In an image sensor according to embodiments of the present invention, the transistor circuit (not shown) and the photodiode 160 can provide a vertical-type integration on the semiconductor substrate 10, making it possible to improve the fill factor of the image sensor.

Also, the lower electrode 110 can be electrically isolated from the lower electrode 110 of an adjacent pixel by the device isolating pattern 91, thereby inhibiting cross-talk and noise.

Also, the barrier wiring 85 can inhibit punch-through and improve the reliability of the image sensor.

FIGS. 1 to 9 are cross-sectional views showing a method for manufacturing an image sensor according to an embodiment of the present invention.

Figure 1:
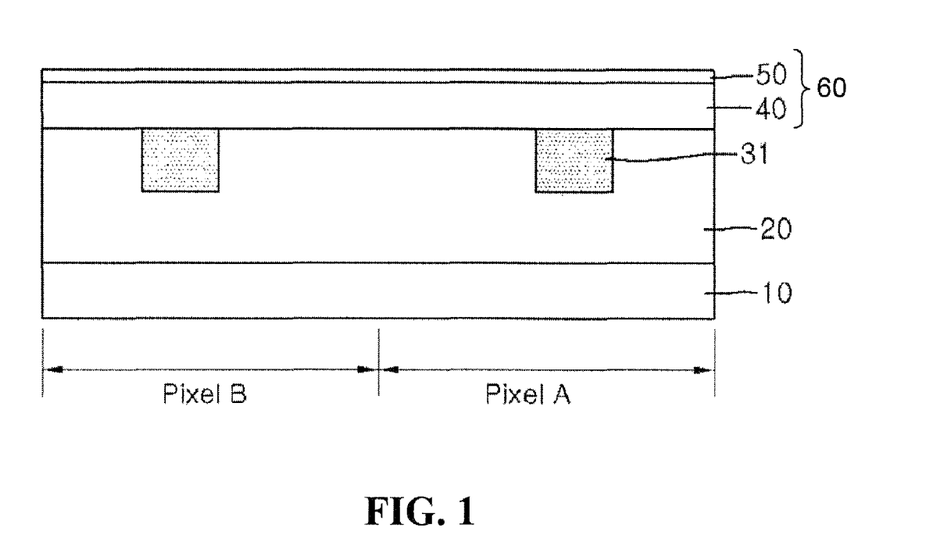
FIGS. 1 to 9 are cross-sectional views showing a manufacturing process of an image sensor according to an embodiment of the present invention.

Referring to FIG. 1, a lower insulating layer 20 can be formed on a semiconductor substrate 10. Though one lower insulating layer 20 has been shown by way of example, any suitable number of lower insulating layers can be formed. A lower wiring 31 can be formed in the lower insulating layer 20.

A transistor circuit region (not shown) can be provided on the semiconductor substrate 10 and electrically connected to the lower wiring 31 in each unit pixel. The transistor circuit region can include, for example, a transfer transistor, a reset transistor, a drive transistor, and/or a select transistor. Each unit pixel on the semiconductor substrate 10 can be provided with a transistor circuit. Though two unit pixels, pixel A and pixel B have been shown for illustration purposes, a skilled artisan will recognize that any suitable number of pixels can be present in an image sensor of the present invention.

In an embodiment, a power supply line or a signal line (not shown) can be formed on the semiconductor substrate 10.

A lower wiring 31 can be formed for each unit pixel to electrically connect a photodiode to a transistor circuit region.

The lower wiring 31 can be formed of any suitable material known in the art, such as a metal, an alloy, or silicide. For example, the lower wiring 31 can be formed of aluminum, copper, cobalt, tungsten, or any combination thereof.

In an embodiment, a top surface of the lower insulating layer 20 can be approximately the same as a top surface of the lower wiring 31, such that the lower insulating layer 20 does not completely surround the lower wiring 31. The lower insulating layer 20 can be formed of any suitable material known in the art, for example, the lower insulating layer 20 can be formed of an oxide film or a nitride film.

An upper insulating layer 60 can be formed on the lower insulating layer 20 and the lower wiring 31.

A skilled artisan will recognize that the upper insulating layer 60 can include any suitable number of insulating layers. Thus, while a first insulating layer 40 and a second insulating layer 50 are shown by way of example, embodiments of the present invention are not limited thereto.

Figure 2:
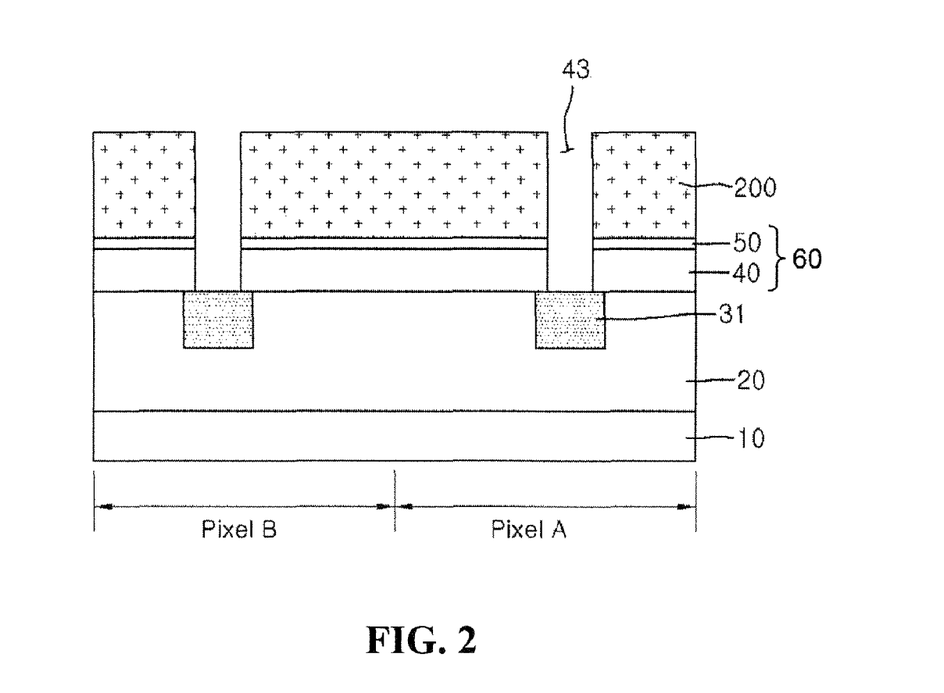

Referring to FIG. 2, a trench 43 can be formed in the upper insulating layer 60 to expose at least a portion of the lower wiring 31.

In an embodiment, to form the trench 43, a first photoresist pattern 200 can be formed on the second insulating layer 50. The first photoresist pattern 200 can be formed to expose at least a portion of the second insulating layer 50 over the lower wiring 31. The first insulating layer 40 and the second insulating layer 50 can be etched using the first photoresist pattern 200 as an etching mask.

Then, the first photoresist pattern 200 can be removed.

Figure 3:
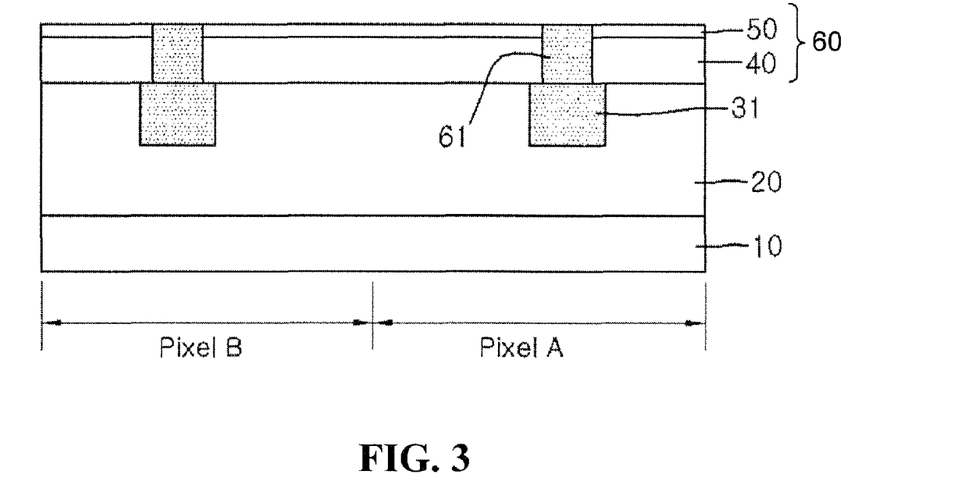

Referring to FIG. 3, the first wiring 61 can be formed in the trench 43.

In an embodiment, when forming the first wiring 61, a metal layer (not shown) can be deposited on the upper insulating layer 60 and in the trench 43. The metal layer (not shown) can be planarized to remove at least a portion of the metal layer not in the trench 43.

The first wiring 61 can be formed of any suitable material known in the art, such as a metal, an alloy, or silicide. For example, the first wiring 61 can be formed of aluminum, copper, cobalt, tungsten, or any combination thereof.

Figure 4:
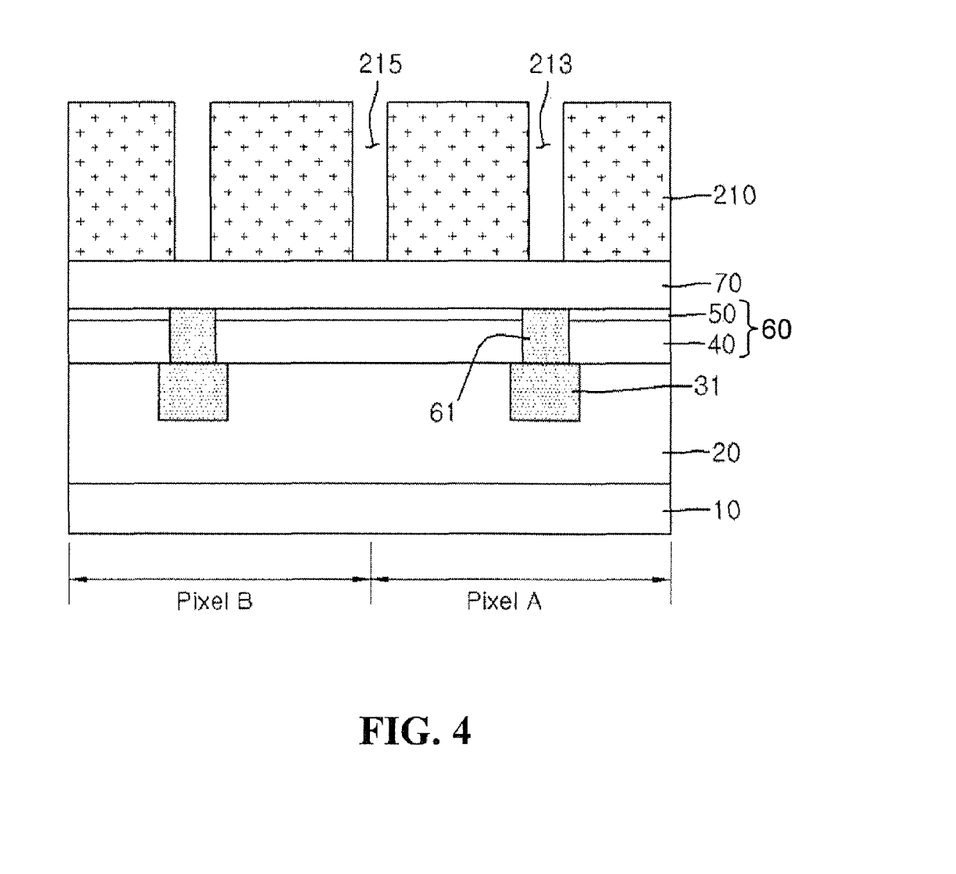

Referring to FIG. 4, a third insulating layer 70 can be formed on the second insulating layer 50 and the first wiring 61. A second photoresist pattern 210 can be formed on third insulating layer 70.

The third insulating layer 70 can be formed of any suitable material known in the art, for example, an oxide film or a nitride film. In an embodiment, the second insulating layer 50 can be formed of a nitride film, and the third insulating layer 70 can be formed of an oxide film.

The second photoresist pattern 210 can include a first hole 213 exposing a portion of the third insulating layer 70 over the first wiring 61. The second photoresist pattern 210 can also include a second hole 215 exposing a portion of the third insulating layer 70 that can be between the first wiring 61 and a first wiring 61 of an adjacent pixel. The second hole 215 can be formed in portions of the first insulating layer 40, the second insulating layer 50, and the third insulating layer 70 which are not over the lower wiring 31 and the first wiring 61.

In an embodiment, the second photoresist pattern 210 can be formed in a mesh-type pattern when viewed from above.

Figure 5:
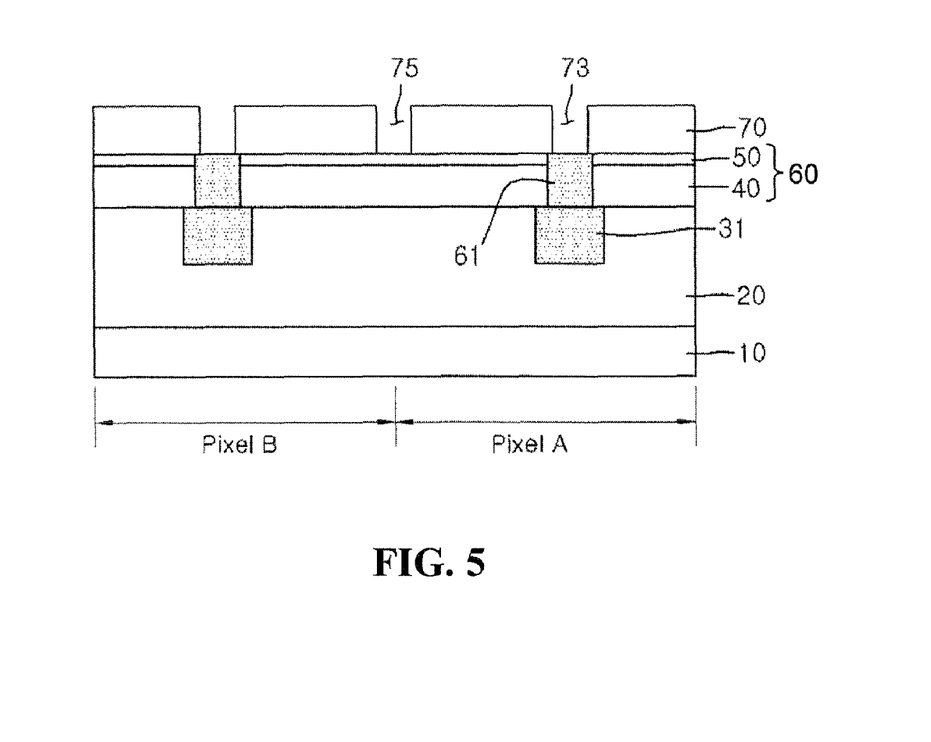

Referring to FIG. 5, a first via hole 73 and a second via hole 75 can be formed in the third insulating layer 70.

In an embodiment, the first via hole 73 and the second via hole 75 can be formed by etching the third insulating layer 70 using the second photoresist pattern 21 as an etching mask. The second insulating layer 50 can be used as an etch stop layer for the second via hole 75, and the first wiring 61 can be used as an etch stop layer for the first via hole 73 when etching the third insulating layer 70. Accordingly, the first via hole 73 and the second via hole 75 can be formed to have approximately the same depth.

The first via hole 73 can be formed to expose the first wiring 61, and the second via hole 75 can be formed to expose a portion of the second insulating layer 50 in a region between pixels.

Then, the second photoresist pattern 210 can be removed.

Figure 6:
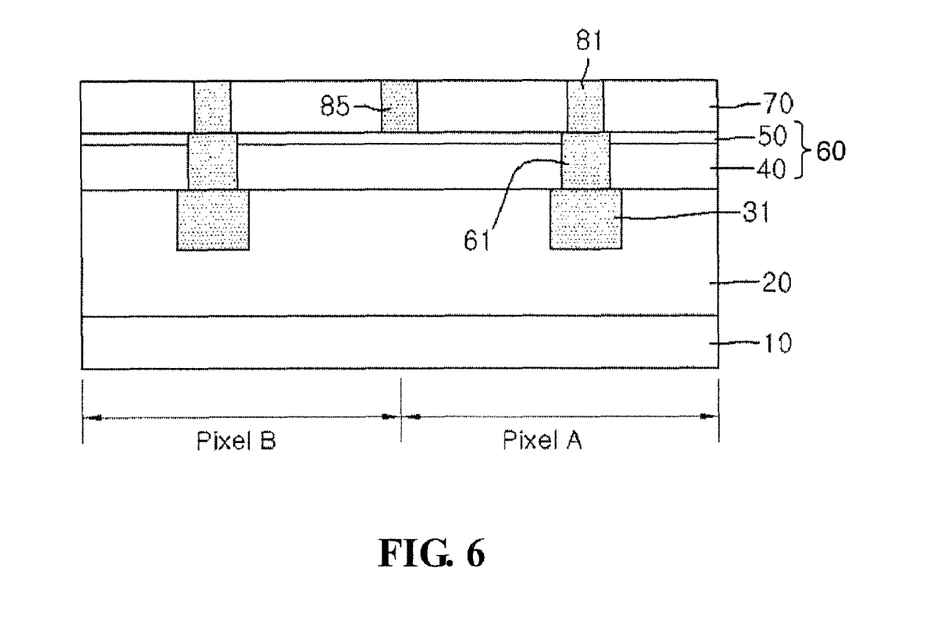

Referring to FIG. 6, a second wiring 81 can be formed in the first via hole 73, and a barrier wiring 85 can be formed in the second via hole 75.

In an embodiment, the second wiring 81 and the barrier wiring 85 can be formed by depositing a metal layer (not shown) on the third insulating layer 70 and in the first via hole 73 and the second via hole 75. A planarization process can be performed to remove at least a portion of the metal layer not in the first via hole 73 or the second via hole 75.

The second wiring 81 can be formed of any suitable material known in the art, such as a metal, an alloy, or silicide. For example, the second wiring 81 can be formed of aluminum, copper, cobalt, tungsten, or any combination thereof. Also, the barrier wiring 85 can be formed of any suitable material known in the art, such as a metal, an alloy, or silicide. For example, the barrier wiring 85 can be formed of aluminum, copper, cobalt, tungsten, or any combination thereof.

The second wiring 81 can be electrically connected to the lower wiring 31 by the first wiring 61 and can help transfer photo charges generated from a photodiode to a transistor circuit in a unit pixel.

The barrier wiring 85 can be arranged between the second wiring 81 of a unit pixel and an adjacent second wiring 81 of an adjacent unit pixel and can help isolate unit pixels by inhibiting movement of electrons from the second wiring 81 of a unit pixel to the second wiring 81 of an adjacent unit pixel.

In certain embodiments, when processing photo charges of a photodiode by application of a voltage to the second wiring 81, a voltage lower than that of the second wiring 81 can be applied to the barrier wiring 85, thereby forming a barrier inhibiting the movement of electrons. Also, a punch-through phenomenon between unit pixels can be inhibited.

Figure 7:
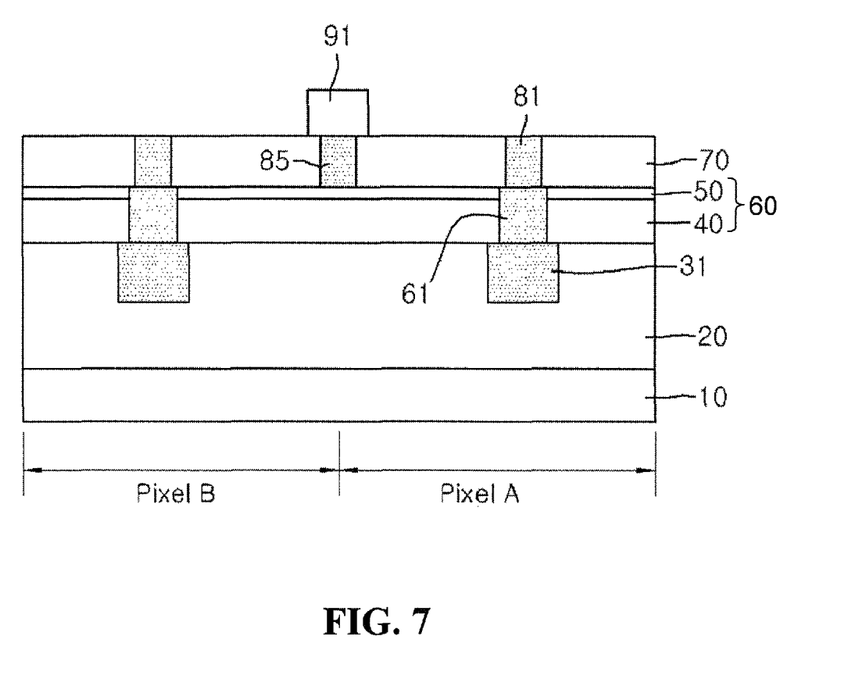

Referring to FIG. 7, a device isolating pattern 91 can be formed on the barrier wiring 85. In an embodiment, the device isolating pattern 91 can be formed over the barrier wiring 85 and at least a portion of the third insulating layer 70. The device isolating pattern 91 can be formed of any suitable material known in the art, for example, an oxide film or a nitride film.

In an embodiment, when forming the device isolating pattern 91, an insulating layer (not shown) can be deposited on the third insulating layer 70, the second wiring 81, and the barrier wiring 85. The insulating layer (not shown) can be etched to expose the second wiring 81 and at least a portion of the third insulating layer 70 not over the barrier wiring 85, thereby forming the device isolating pattern 91. In an embodiment, the device isolating pattern 91 can be formed over the barrier wiring 85. In a further embodiment, the device isolating pattern 91 can be formed over the barrier wiring 85 and over a small portion of the third insulating layer 70 adjacent to the barrier wiring 85. This can allow a lower electrode 110 to cover much of the third insulating layer 70.

Figure 8:
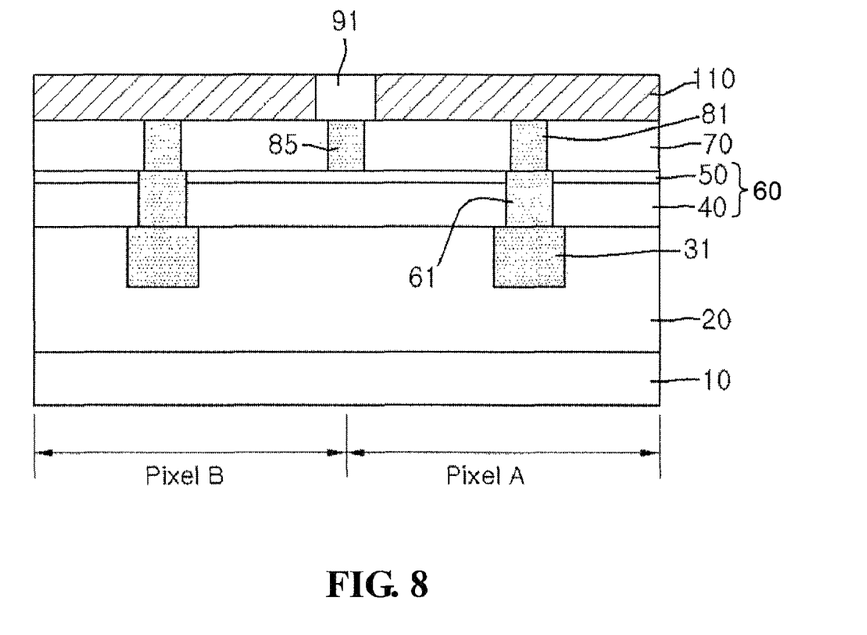

Referring to FIG. 8, the lower electrode 110 can be formed on the second wiring 81 and at least a portion of the third insulating layer 70. The lower electrode 110 can be formed of any suitable material known in the art, for example, a metal such as chromium, titanium, tungsten, tantalum, or any combination thereof.

In an embodiment, the lower electrode 100 can be formed by depositing a metal layer (not shown) on the second wiring 81, the third insulating layer 70, and the device isolating pattern 91. A planarization process, such as a chemical mechanical polishing (CMP) process can then be performed. When forming the lower electrode 110, the device isolating pattern 91 can be a polishing stop point of the CMP process. Accordingly, since the device isolating pattern 91 can separate unit pixels, a lower electrode 110 can be formed for each unit pixel.

The lower electrode 110 of unit pixel A can be electrically connected to the second wiring 81 of unit pixel A and electrically isolated from the lower electrode 110 of neighboring unit pixel B by the device isolating pattern 91. In an embodiment, the lower electrode 110 can be formed on the second wiring 81 and the portion of the third insulating layer 70 that is not covered by the device isolating pattern 91. Therefore, the area of the lower electrode 110 can be maximized, thereby helping to increase the collection rate of photo charges generated from the photodiode 160.

Referring again to FIG. 9, the photodiode 160 can be formed on the lower electrode 110 and the device isolating pattern 91, an upper electrode 170 can be formed on the photodiode 160, and a color filter 180 can formed on the upper electrode 170.

In an embodiment, the photodiode 160 can includes an n-type conducting layer, an intrinsic layer, and a p-type conducting layer.

That is, in an embodiment, the photodiode can be an N-I-P diode. The N-I-P diode can be formed in a junction structure of n-type amorphous silicon, intrinsic amorphous silicon, and p-type amorphous silicon. Though an N-I-P structure has been shown by way of example, embodiments of the present invention are not limited thereto. The structure of the photodiode can be formed in any suitable structure known in the art, for example, P-I-N, N-I-P, or I-P.

In an embodiment where an N-I-P structure can be used, the n-type amorphous silicon layer can be referred to as a first conducting layer 130, the intrinsic amorphous silicon layer can be referred to as an intrinsic layer 140, and the p-type amorphous silicon layer can be referred to as a second conducting layer 150.

The first conducting layer 130 can be formed on the lower electrode 110 and the device isolating pattern 91. The first conducting layer 130 can be formed using, for example, n-doped amorphous silicon.

The intrinsic layer 140 can be formed on the first conducting layer 130. The intrinsic layer 140 can be formed using, for example, amorphous silicon.

In an embodiment, the intrinsic layer 140 can be formed to a thickness about 10 to 1000 times larger than that of the first conducting layer 130.

The second conducting layer 150 can be formed on the intrinsic layer 140. The second conducting layer 150 can be formed using, for example, p-doped amorphous silicon. In an embodiment, the second conducting layer 150 can be formed to a thickness approximately equal to that of the first conducting layer 130. In another embodiment, the second conducting layer 150 can be formed with the intrinsic layer 140 in a continuous process.

The photodiode 160 can be formed on the semiconductor substrate 10 including the transistor circuit (not shown) so that the area of the photodiode 160 can be maximized, thereby increasing the fill factor to approximately 100%.

The upper electrode 170 can be formed on the second conducting layer 150 of the photodiode 160.

In an embodiment, the upper electrode 170 can be formed of a transparent electrode with good light transmissivity and high conductivity. For example, the upper electrode 170 can be formed of indium tin oxide (ITO), cadmium tin oxide (CTO), or zinc oxide ($ZnO_2$).

The color filter can be formed on the upper electrode 170.

The color filter 180 can use a dyed photoresist, and one color filter can be formed in each unit pixel to separate colors from incident light.

Although not shown, in certain embodiments, a microlens can be formed on the color filter 180.

If a voltage bias is applied to the lower electrode 110 and the upper electrode 170, light incident on the photodiode 160 can be converted into photo charges and collected in the lower electrode 110 of each unit pixel. The photo charges can be transferred to the transistor circuit (not shown) of the corresponding unit pixel through the second wiring 81 and the first wiring 61 in each unit pixel.

The lower electrode 110 of a unit pixel can be separated from an adjacent lower electrode 110 of an adjacent pixel by the device isolating pattern 91 so that the photo charges of the photodiode 160 can be moved to the lower electrode 110 of the corresponding unit pixel, thereby making it possible to inhibit cross-talk and noise.

Also, the barrier wiring 85 can be formed between the second wiring 81 and an adjacent second wiring 81 of an adjacent pixel to inhibit movement of the photo charges generated in unit pixel A to adjacent unit pixel B, thereby helping block generation of cross-talk and noise.

If a voltage bias is applied to the lower electrode 110 and the upper electrode 170 to generate photo charges from the photodiode 160, the photo charges can be transferred to the transistor circuit (not shown) through the signal transfer wiring of the corresponding unit pixel. In a related art, if a large amount of light is incident on the unit pixel A and a small amount of light is incident on adjacent unit pixel B, the potential of unit pixel B can become high, leading to the photo charges in unit pixel A moving to unit pixel B. In embodiments of the present invention, the barrier wiring 85 can be formed between unit pixel A and unit pixel B to inhibit movement of photo charges between the unit pixels. When voltage lower than that applied to the unit pixels is applied to the barrier wiring 85, the barrier wiring 85 can form a barrier between the unit pixels, thereby inhibiting the movement of electrons to adjacent pixels through the barrier. Therefore, the photo charges generated from the photodiode in each unit pixel can be electrically isolated from adjacent pixels by the barrier wiring 85, thereby inhibiting cross-talk and noise.

According to embodiments of the present invention, vertical integration of a transistor circuit and a photodiode can be provided.

Also, the lower electrode of the photodiode can be separated from that of an adjacent unit pixel, making it possible to inhibit cross-talk and noise.

Additionally, a barrier can be formed between the unit pixels by the barrier wiring to inhibit the punch-through phenomenon and improve the reliability of the image sensor.

Furthermore, the area of the lower electrode can be maximized so that electrons generated from the photodiode can be concentrated on the lower electrode, thereby improving the receiving capacity of electrons.

Moreover, the fill factor of the image sensor can reach approximately 100% by the vertical integration of the transistor circuit and the photodiode.

The vertical integration can also provide higher sensitivity at the same pixel size as compared to a related art.

In addition, each unit pixel can implement a more complicated circuit without reducing sensitivity.

According to embodiments of the present invention, the surface area of the photodiode in each unit pixel can be increased, making it possible to improve light sensitivity of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
   an insulating layer provided on a semiconductor substrate and having a wiring arranged according to a unit pixel;
   a barrier wiring provided in at least a portion of the insulating layer between the wiring of the unit pixel and an adjacent wiring of an adjacent pixel;
   a device isolating pattern provided on the barrier wiring;
   a lower electrode provided on the wiring and at least a portion of the insulating layer, wherein a top surface of the device isolating pattern is approximately even with a top surface of the lower electrode;
   a photodiode provided on the device isolating pattern and the lower electrode; and
   an upper electrode provided on the photodiode.

2. The image sensor according to claim 1, wherein the device isolating pattern comprises an oxide film or a nitride film.

3. The image sensor according to claim 1, further comprising a color filter provided on the upper electrode.

4. The image sensor according to claim 1, wherein the device isolating pattern is provided on the barrier wiring and at least a portion of the insulating layer.

5. The image sensor according to claim 1, wherein the insulating layer comprises:
   a lower insulating layer;
   an upper insulating layer provided on the lower insulating layer; and
   a third insulating layer provided on the upper insulating layer; and
   wherein the wiring comprises:
   a lower wiring provided in the lower insulating layer;
   a first wiring provided in the upper insulating layer; and
   a second wiring provided in the third insulating layer.

6. The image sensor according to claim 5, wherein the barrier wiring is provided on the upper insulating layer and in the third insulating layer.

7. The image sensor according to claim 5, wherein the barrier wiring is connected to a voltage signal line for applying applied a lower voltage than that applied to the second wiring.

8. The image sensor according to claim 5, wherein the second wiring and the barrier wiring are formed of the same material.

9. The image sensor according to claim 5, wherein the upper insulating layer comprises:
   a first insulating layer provided on the lower insulating layer; and
   a second insulating layer provided on the first insulating layer.

10. A method for manufacturing an image sensor, comprising:

forming an insulating layer on a semiconductor substrate;
forming a wiring in the insulating layer arranged according to a unit pixel;
forming a barrier wiring in the insulating layer between the wiring of one unit pixel and an adjacent wiring of an adjacent pixel;
forming a device isolating pattern on the barrier wiring;
forming a lower electrode on the wiring and at least a portion of the insulating layer, wherein a top surface of the lower electrode is approximately even with a top surface of the device isolating pattern;
forming a photodiode on the device isolating pattern and the lower electrode; and
forming an upper electrode on the photodiode.

11. The method according to claim 10, wherein forming the lower electrode comprises:
forming a metal layer on the device isolating pattern, the wiring, and at least a portion of the insulating layer;
performing a chemical mechanical polishing (CMP) process on the metal layer to form the lower electrode.

12. The method according to claim 11, wherein, when performing the CMP process on the metal layer, the device isolating pattern is used as the polishing stop point.

13. The method according to claim 10, wherein the device isolating pattern comprises an oxide film or a nitride film.

14. The method according to claim 10, further comprising forming a color filter on the upper electrode.

15. The method according to claim 10, wherein forming the insulating layer, the wiring, and the barrier wiring comprises:
forming a lower insulating layer having a lower wiring on the semiconductor substrate;
forming an upper insulating layer on the lower insulating layer and the lower wiring;
forming a trench in the upper insulating layer exposing at least a portion of the lower wiring;
depositing a first metal layer on the upper insulating layer and in the trench;
forming a first wiring in the trench by planarizing the first metal layer to remove a portion of the first metal layer not in the trench;
forming a third insulating layer on the upper insulating layer and the first wiring;
forming a first via hole in the third insulating layer exposing at least a portion of the first wiring;
forming a second via hole in the third insulating layer exposing a portion of the upper insulating layer not over the lower wiring;
depositing a second metal layer on the third insulating layer and in the first via hole and the second via hole; and
forming a second wiring in the first via hole and the barrier wiring in the second via hole by planarizing the second metal layer to remove a portion of the second metal layer not in the first via hole or the second via hole;
wherein the wiring comprises the lower wiring, the first wiring, and the second wiring.

16. The method according to claim 15, wherein forming the upper insulating layer comprises:
forming a first insulating layer on the lower insulating layer; and
forming a second insulating layer on the first insulating layer.

17. The method according to claim 15, wherein the lower wiring is electrically connected to the lower electrode.

18. The method according to claim 10, wherein forming the device isolating pattern on the barrier wiring comprises forming the device isolating pattern on the barrier wiring and at least a portion of the insulating layer.

* * * * *